United States Patent [19]
Higashida

[11] Patent Number: 6,035,431
[45] Date of Patent: Mar. 7, 2000

[54] SEMICONDUCTOR INTEGRATED CIRCUIT WITH TEST DEVICE

[75] Inventor: Motoki Higashida, Tokyo, Japan

[73] Assignee: Mitsubishi Denki Kabushiki Kaisha, Tokyo, Japan

[21] Appl. No.: 09/030,950

[22] Filed: Feb. 26, 1998

[30] Foreign Application Priority Data

Oct. 2, 1997 [JP] Japan .................................. 9-270087

[51] Int. Cl.⁷ .................................................. G01R 31/28
[52] U.S. Cl. .......................................... 714/726; 714/731
[58] Field of Search ................................... 714/738, 739, 714/744, 742, 724, 726, 727, 728, 729, 730, 731, 30

[56] References Cited

U.S. PATENT DOCUMENTS 5,394,403  2/1995  Klein ........................................ 714/718
5,416,409  5/1995  Hunter .................................... 324/158.1
5,544,174  8/1996  Abend ...................................... 714/726
5,708,773  1/1998  Jeppesen, III et al. .................. 714/30

FOREIGN PATENT DOCUMENTS

59-178374  10/1984  Japan .
6-195477   7/1994   Japan .
9-503302   3/1997   Japan .

*Primary Examiner*—Trinh L. Tu
*Attorney, Agent, or Firm*—Burns, Doane, Swecker & Mathis, LLP

[57] ABSTRACT

A semiconductor integrated circuit (1) has a scan test circuit (6) and a target test circuit (4), connected to a CPU (3) and a RAM (2) through internal buses (5a and 5b) that are mounted on a same semiconductor chip. The scan test circuit (6) provides test signals to the target test circuit (4) having a plurality of flip flops connected one another in a line like a string of beads as a shift register.

17 Claims, 5 Drawing Sheets

SEMICONDUCTOR INTEGRATED CIRCUIT WITH TEST DEVICE

BACKGROUND OF THE INVENTION

1. Field of the Invention

The present invention relates to a semiconductor integrated circuit with a test device comprising a central processing unit (hereinafter, referred to as a CPU), internal memory means (hereinafter, referred to as RAM), a target test circuit (hereinafter, referred to as an user logic section) in which a plurality of flip flop circuits connected one another in a line like a string of beads that are operable as shift registers, and a scan test circuit, that are mounted on a same semiconductor chip.

2. Description of the Prior Art

Figure 1:
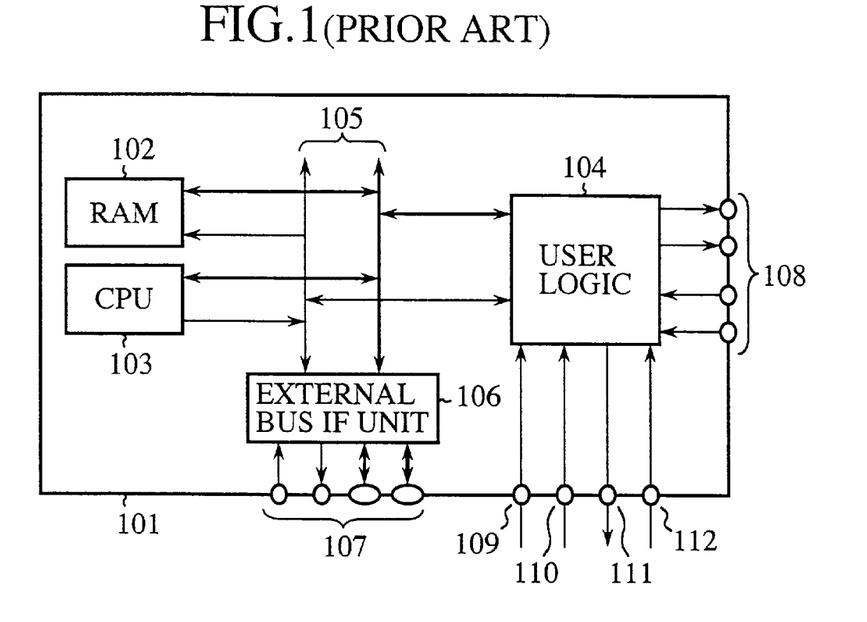
FIG. 1 is a diagram showing a configuration of a conventional semiconductor integrated circuit as one example.

FIG.1 is a diagram showing a configuration of a conventional semiconductor integrated circuit as a conventional example. In FIG.1, the reference number 101 indicates a semiconductor chip on which a random access memory (RAM) 102, a CPU 103, a user logic section 104 as a target test circuit, and an internal bus group 105 through which the RAM 102, the CPU 103, the user logic section 104 are electrically connected to each other. The reference number 106 denotes an external bus interface (IF) unit for connecting the internal bus group 105 to input/output terminals 107. The reference number 108 indicates input/output terminals of the user logic section 104. The reference number 109 designates a scan clock terminal through which a scan clock signal is provided from a logic tester 113 to the user logic section 104. The reference number 111 denotes a scan-in terminal of the user logic section 104, and 112 indicates a test terminal of the user logic section 104.

Figure 2:
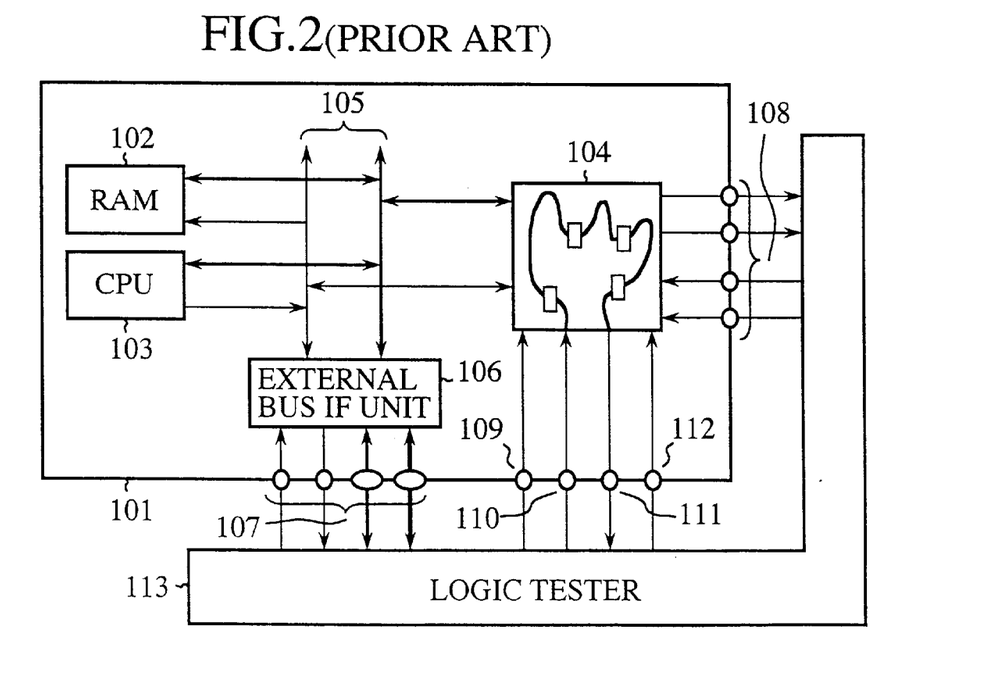
FIG. 2 is a diagram showing a configuration of the semiconductor integrated circuit shown in FIG. 1 and a conventional tester.

FIG.2 is a diagram showing a configuration of a logic tester and the conventional semiconductor integrated circuit shown in FIG.1. In FIG.2, the reference number 113 designates the logic tester connected to the input terminals 108 and each of the terminals 109 to 112 in the conventional semiconductor integrated circuit. The external bus IF unit 106 is used for accessing the external RAM (omitted from the diagram) by the CPU 103 or used for accessing the user logic section 104 or the RAM 102 by an external device (omitted from the diagram) through the internal bus.

Next, a description will be given of the operation of the conventional semiconductor integrated circuit.

In the prior art, in order to easily perform the testing operation for the user logic section 104 incorporated in the conventional semiconductor integrated circuit, the plurality of Flip flops in the user logic section 104 are so made that data items may be written to or read from the flip flops by a scan method. In the scan method, all of the flip flops in the user logic section 104 are connected one another in a line like a string of beads. In the scan test mode, all of the flip flops in the user logic section 104 are performed as a shift register and a plurality of scan data items are inputted to the user logic section 104 through the scan-in terminal 110 and scan results of the user logic section 104 are output to the logic tester 113 through the scan-out terminal 111. It is thereby possible to treat the internal circuit in the user logic 104 as a combinational circuit and possible to achieve a self-diagnose function of the semiconductor integrated circuit. This scan method is widely well known, for example, it is shown in conventional textbooks in a computer design field.

Because the tester for the conventional semiconductor integrated circuit has the configuration described above, in order to perform the test of the user logic 104, it must be required to connect the semiconductor integrated circuit to the tester 113 whose cost is expensive through the terminals 107, 108, and 109 to 112. In addition to this, it must be required to form dedicated test pins only for use in the-scan test in the semiconductor integrated circuit. Furthermore, the number of the test pins formed in the semiconductor integrated circuit is limited in area. Furthermore, in the scan method, it must be required to generate scan clocks corresponding to the number of the flip flops in the user logic section 104 for the readout/write-in of data items in the flip flops. This causes to increase the time of the scan test. In order to decrease the time of the scan test, it may be possible to increase the number of ring-lines of the flip flops as a shift register. However, this scan method increases the number of terminals for testing and increases the size of the configuration of the semiconductor integrated circuit and the configuration of the semiconductor integrated circuit becomes complicated.

SUMMARY OF THE INVENTION

Accordingly, an object of the present invention is, with due consideration to the drawbacks of the conventional semiconductor integrated circuit, to provide a semiconductor integrated circuit with a test device that is capable of reducing a test time without using any expensive tester, capable of reducing the number of terminals in the semiconductor integrated circuit for use in the test, and it is thereby possible to achieve a simple configuration of the semiconductor integrated circuit.

In accordance with a preferred embodiment of the present invention, a semiconductor integrated circuit having a test device comprises a central processing unit (CPU), internal memory means, a target test circuit comprising a plurality of flip flops that are connected one another in a line like a string of beads as a shift register, and a scan test circuit for providing test data to the target test circuit in order to perform the plurality of flip flops as the shift register. In the semiconductor integrated circuit, the CPU, the internal memory means, the target test circuit, and the scan test circuit are connected through internal buses and are mounted on a same semiconductor chip.

In the semiconductor integrated circuit as another preferred embodiment of the present invention, the scan test circuit comprises an address decoder connected to an address bus forming the internal buses, a plurality of flip flops, each flip flop is addressed by an address decoded by the address decoder, connected to the plurality of flip flops in the target test circuit in order to perform as a shift register, and for inputting and outputting data items between the target test circuit, the CPU, and the internal memory means through a data bus forming the internal buses.

In accordance with another preferred embodiment of the present invention, a semiconductor integrated circuit having a test device comprises a central processing unit (CPU), internal memory means, a target test circuit comprising a plurality of flip flops that are connected one another in a line like a string of beads as a shift register, a scan test circuit for performing the plurality of flip flops in the target test circuit as the shift register, (the CPU, the internal memory means, the target test circuit, and the scan test circuit are connected through internal buses and are mounted on a same semiconductor chip), an input signal generation and output signal detection circuit, connected to the target circuit through external buses, for generating and providing test data to the target test circuit, and for detecting output signals transferred from the target test circuit, and an external memory means, connected to the input signal generation and output signal detection circuit through the external buses and the internal buses, for storing the test data.

In the semiconductor integrated circuit as another preferred embodiment of the present invention, the input signal generation and output signal detection circuit comprises a plurality of flip flops for storing the output signals from the target test circuit to detect the output signals, a plurality of flip flops for setting the input signals to be transferred to the target test circuit, an address decoder for decoding an address transferred from the CPU and for accessing the plurality of flip flops for the input signals and the output signals based on the decoded result, and control means for controlling to input the test data from the external memory means.

The semiconductor integrated circuit as another preferred embodiment of the present invention, further comprises external memory means for storing data relating the test data and for providing the test data to the internal memory means mounted on the semiconductor chip.

In the semiconductor integrated circuit as another preferred embodiment of the present invention, the external memory means stores the test data and provides the test data to the internal memory means mounted on the semiconductor chip.

In the semiconductor integrated circuit as another preferred embodiment of the present invention, the external memory means stores compressed test data and test program including an extraction process for extracting the compressed test data, the CPU executes the test program stored in the internal memory means to extract the compressed test data and then executes the test program after the compressed test data and the test program have been transferred to the internal memory means.

In the semiconductor integrated circuit as another preferred embodiment of the present invention, the scan test circuit comprising a plurality of flip flops that are connected to the plurality of flip flops in the target test circuit in order to form the shift register.

As another preferred embodiment of the present invention, a system of a semiconductor integrated circuit having a test device, the system comprises a central processing unit (CPU), internal memory means, a target test circuit comprising a plurality of flip flops that are connected one another in a line like a string of beads as a shift register, a scan test circuit for performing the plurality of flip flops in the target test circuit as the shift register (wherein, the CPU, the internal memory means, the target test circuit, and the scan test circuit are connected through internal buses and are mounted on a same semiconductor chip), an input signal generation and output signal detection circuit, connected to the target circuit through external buses, for generating and providing test data to the target test circuit, and for detecting output signals transferred from the target test circuit, an external memory means, connected to the input signal generation and output signal detection circuit through the external buses and the internal buses, for storing the test data, and a host computer, connected to the external memory means, for providing data including the test data and a test program to be stored in the external memory means, and for changing contents of the data stored in the external memory means.

In the semiconductor integrated circuit as another preferred embodiment of the present invention, the external memory means comprises a read only memory or a random access memory, and the internal memory means comprises a random access memory.

BRIEF DESCRIPTION OF THE DRAWINGS

These and other objects, features, aspects and advantages of the present invention will become more apparent from the following detailed description of the present invention when taken in conjunction with the accompanying drawings, in which.

DESCRIPTION OF THE PREFERRED EMBODIMENTS

Other features of this invention will become apparent through the following description of preferred embodiments which are given for illustration of the invention and are not intended to be limiting thereof.

Preferred embodiments of a semiconductor integrated circuit with a test device according to the present invention will now be described with reference to the drawings.

First Embodiment

Figure 3:
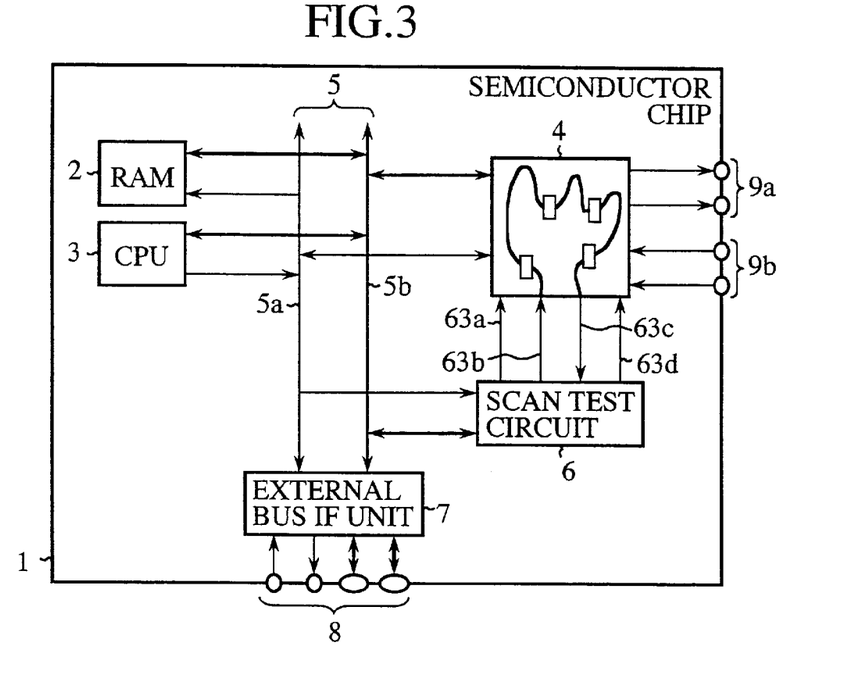
FIG. 3 is a diagram showing a configuration of a semiconductor integrated circuit having a test device as the first embodiment according to the present invention.

FIG. 3 is a diagram showing a configuration of a semiconductor integrated circuit having a test device as the first embodiment according to the present invention. In FIG. 3, the reference number 1 designates a semiconductor integrated circuit on which a random access memory (RAM) as an internal memory means, a central processing unit (CPU) as a central processing means, a user logic section as a target test circuit, internal buses connected to the RAM 2, the CPU 3, the user logic section 4 to each other, and a circuit 6 for a scan test (or a scan test circuit) that is connected to both user logic section 4 and the internal buses 5. The reference number 7 designates an external bus IF unit through which the internal buses 5 are connected to the input/output terminals 8. The reference numbers 9a and 9b denote input/output terminals for the user logic 4. The internal buses 5 are made up of an internal address bus 5a and an internal data bus 5b.

Figure 4:
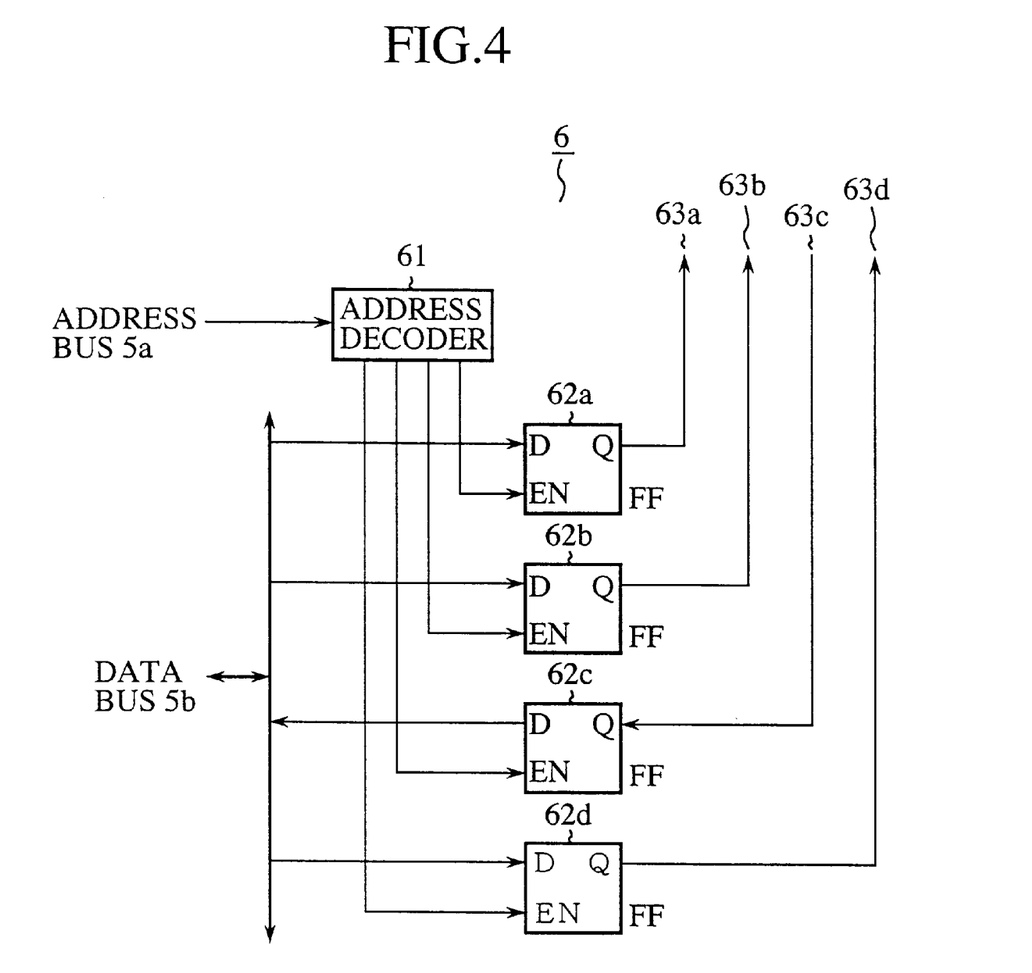
FIG. 4 is a diagram showing a configuration of a test circuit (or test device) for a scan test in the semiconductor integrated circuit as the first embodiment shown in FIG 3.

FIG. 4 is a diagram showing a configuration of the scan test circuit 6 for a scan test in the semiconductor integrated circuit as the first embodiment shown in FIG. 3. In FIG. 4, the scan test circuit 6 for the scan test comprises an address decoder 61 connected to the address bus 5a and flip flops (FF) 62a to 62d. Each FF has a data enable terminal EN connected to the output terminal of the address decoder 61 and the data terminal D connected to the data bus 5b. The output terminals of the FF 61a, 62b, and 62d, each having the data enable terminal EN, are connected to the scan clock terminal, the scan-in terminal, and the test mode terminal, respectively. The input terminal D of the FF 62c having the data enable terminal EN is connected to the scan-out terminal 63c of the user logic section 4.

Next, a description will be given of the operation of the semiconductor integrated circuit having the test circuit as the first embodiment shown in FIGS. 3 and 4.

Each of the flip flop FF 62a to 62d, each having the data enable terminal, is assigned by its inherent address. The CPU 3 may write a data item to each flip flop FF or read from a data item stored in the flip flop FF by designating the address of the target flip flop FF in the scan test circuit 6. In addition, the flip flips FF 62a to 62d may directly transfer data to and may directly read data from the user logic section 4 through the signal lines 63a to 63d. Thereby, the CPU 3 may read and write data stored in the flip flops 62a, 62b, and 62d (each having the data enable terminal) in the scan test circuit 6 through the internal bus 5 and the CPU 3 may check the obtained data. The checked result by the CPU 3 or the data items stored in the flip flops FF 62a, 62b, and 62d may be accessed by outside devices through the external bus IF unit 7.

As described above in detail, because the semiconductor integrated circuit having the test device as the first embodiment has the configuration in which the scan test circuit 6 is incorporated in the semiconductor chip 1 and the scan test circuit 6 is connected to the test terminals of the user logic section 4 through the signal lines 63a to 63d directly and also connected to the CPU 3, the RAM 2, and the external bus IF unit 7 through the internal buses, it is thereby possible to perform the scan test by the scan test method without any incorporating the dedicated test terminals, whose cost are expensive and whose number is limited in area, in the semiconductor integrated circuit on the semiconductor chip 1.

Second Embodiment

Figure 5:
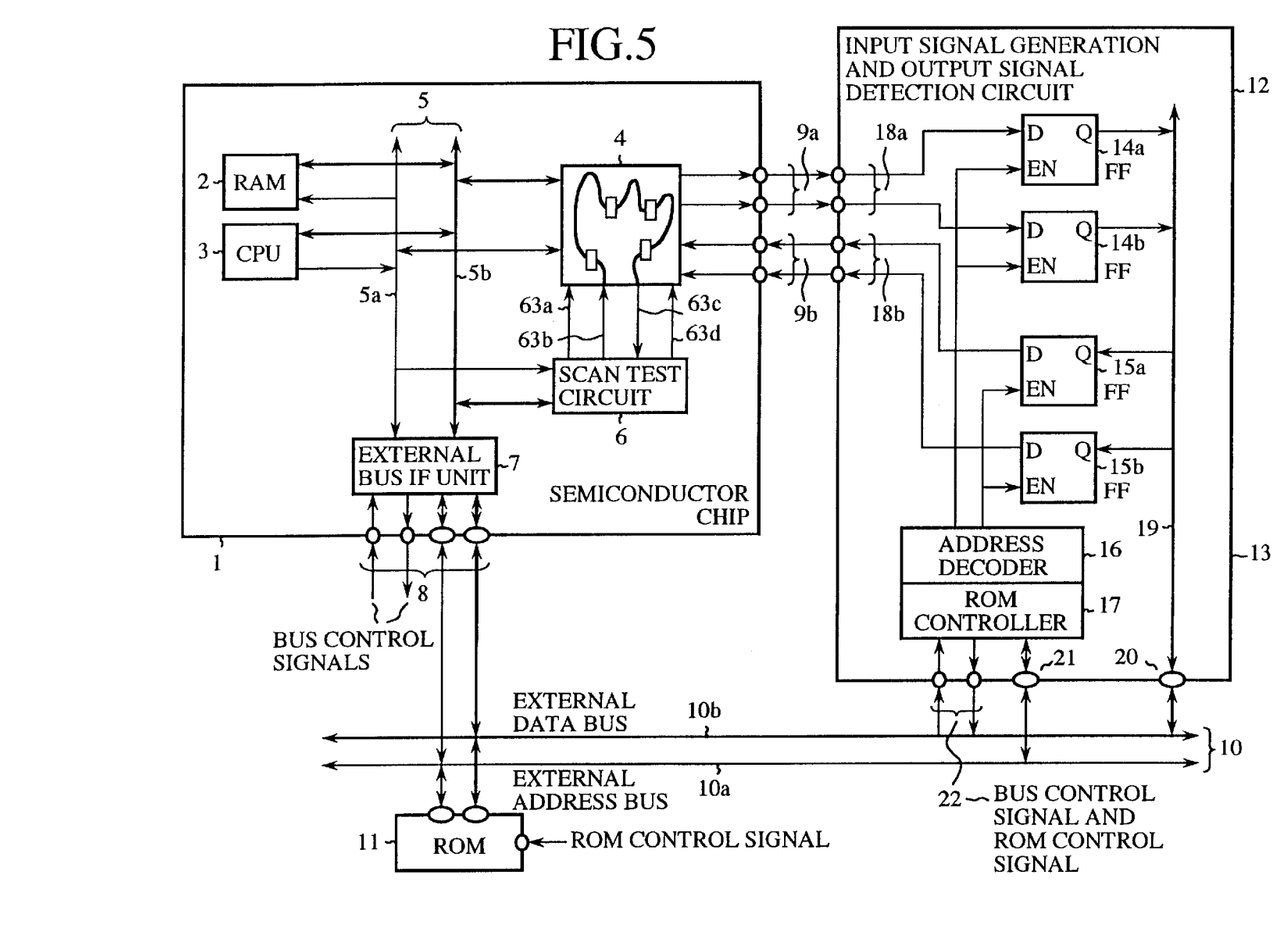
FIG. 5 is a diagram showing a configuration of a semiconductor integrated circuit with a test device as the second and third embodiments according to the present invention.

FIG. 5 is a diagram showing a configuration of the semiconductor integrated circuit with a test device as the second embodiment according to the present invention. In FIG. 5, the reference number 10 designates external buses comprising an external address bus 10a and an external data bus 10b. The reference number 11 denotes a read only memory (ROM) as an external memory means connected to both the external address bus 10a and the external data bus 10b. The reference number 12 indicates an input signal generation and output signal detection circuit. Other components in the semiconductor integrated circuit as the second embodiment are the same as those of the semiconductor integrated circuit of the first embodiment, therefore the explanation of the same components is omitted here for brevity.

The input signal generation and output signal detection circuit 12 comprises flip flops 14a and 14b for storing values of output signals, flip flops 15a and 15b for storing values of input signals, an address decoder 16, and a ROM controller 17 for controlling the operation of the ROM 11. The flip flops 14a to 14b store the values of the output signals provided from the user logic section 4 in the semiconductor integrated circuit mounted on the semiconductor chip 1. The flip flops 15a and 15b provide the values of the input signals to the user logic section 4 in the semiconductor chip 1. The address decoder 16 decodes a target address transferred from the CPU 3 in order to access the flip flops 14a, 14b, 15a, and 15b. The input signal generation and output signal detection circuit 12 further comprises input/output terminals 18a and 18b through which the input/output terminals 9a and 9b are connected to the flip flops 14a, 14b, 15a, and 15b, an input/output terminal 20 through which an internal data bus 19 is connected to the external data bus 10b, an input/output terminal 21 through which the external address bus 10a is connected to the ROM controller 17, and supply terminals 22 for transferring both a bus control signal and a ROM control signal.

The ROM 11 is connected to the internal address bus 5a and the internal data bus 5b through the external bus IF unit 7 in the semiconductor chip 1. A test program and data items to perform the CPU 3 are stored in the ROM 11. This test program includes following various processes:

A process to perform the process to set test data items into the scan flip flops in the user logic section 4 through the scan test circuit 6;

A process to perform the process to set test data items into the input pins of the user logic section 4 through the input signal generation and output signal detection circuit 12;

A process to perform the process to read the data items stored in the scan flip flops in the user logic section 4 through the scan test circuit 6;

A process to perform the process to read the data items on the output pins through the input signal generation and output signal detection circuit 12; and A process to perform the process to compare the readout data items with expected values that are prepared in advance.

In the ROM 11, the test data items for use in the scan test for the user logic section 4 and the expected data items.

In the semiconductor integrated circuit as the second embodiment shown in FIG.5, the number of the input/output terminals in the user logic section 4 used for the scan test is two. However, the present invention is not limited by this embodiment, for example, it is possible in configuration that the number of the input/output terminals in the user logic section 4 is more than two. When the bus width of the external data bus 10b is a 16 bit width, it is possible to input and output data in parallel simultaneously by addressing one address, as shown in FIG. 5. When the bus width of the input data is more than the 16 bit width, input addresses more than two are required for accessing the input data. In addition, it is possible to treat output data by using the same manner described above. Furthermore, it is possible to apply the present invention to data access operation other than the data width of 16 bits.

Next, a description will be given of the operation of the semiconductor integrated circuit having the test device as the second embodiment.

In the semiconductor integrated circuit of the second embodiment, the test signals to be used in the scan test under the control of the CPU 3 are provided to the user logic section 4, and then the same test operation of the semiconductor integrated circuit as the first embodiment is performed. The CPU 3 accesses the ROM 11 through the external buses 10, and then the address controller 16 supplies the data items stored in the ROM 11 to the flip flops FF 14a and 14b to detect the output signals and the flip flops FF 15a and 15b to generate input signals. Then, the output signals from the flip flops FF 14a and 14b, that have been transferred from the user logic section 4, are also transferred to the CPU 3 in order to check those output signals through the internal data bus 19, the external buses 10, the external bus IF unit 7, and the internal bus 5. In addition, the CPU 3 generates and transfers the control signals to the flip flops 15a and 15b for the generation of the input signals through the internal bus 5, the external buses 10, the external bus IF unit 7, and the internal bus 5. Then, the output signal from the flip flops 15a and 15b are transferred to the user logic section 4.

As described above, according to the semiconductor integrated circuit of the second embodiment, it is possible to apply the scan test method to the user logic section 4 without using any expensive external tester and without forming any dedicated pins on the semiconductor chip for testing.

Third Embodiment

The configuration of the semiconductor integrated circuit having a test device for scan test according to the third embodiment is the same as the configuration of the semiconductor integrated circuit of the second embodiment shown in FIG. 5. Accordingly, the same reference numbers of the components are used, and the explanation of the semiconductor integrated circuit of the third embodiment is therefore omitted for brevity.

In the semiconductor integrated circuit of the third embodiment, test data and a test program are stored in the ROM 11 in advance, and when test operation is executed, the test data, the test program, and the like are transferred to the RAM 2 through the external buses 10, the external bus IF unit 7, and the external bus 5.

Next, a description will be given of the operation of the semiconductor integrated circuit of the third embodiment.

After the data items including test program stored in the external ROM 11 are transferred to the RAM 2, the test program is then executed by using the test data such as test patterns and expected values of the test stored in the RAM 2, like the test operation that has already been explained in the explanation of the first embodiment.

As described above, according to the semiconductor integrated circuit of the third embodiment, because the test operation is executed after the data items stored in the external ROM 11 are transferred to the Ram 2, it is possible to reduce the time of the test operation because the accessing time to the RAM 2 in the semiconductor integrated circuit of the third embodiment is shorter than the accessing time to the external ROM 11 located from the semiconductor integrated circuit of the third embodiment, in general.

Fourth Embodiment

Figure 6:
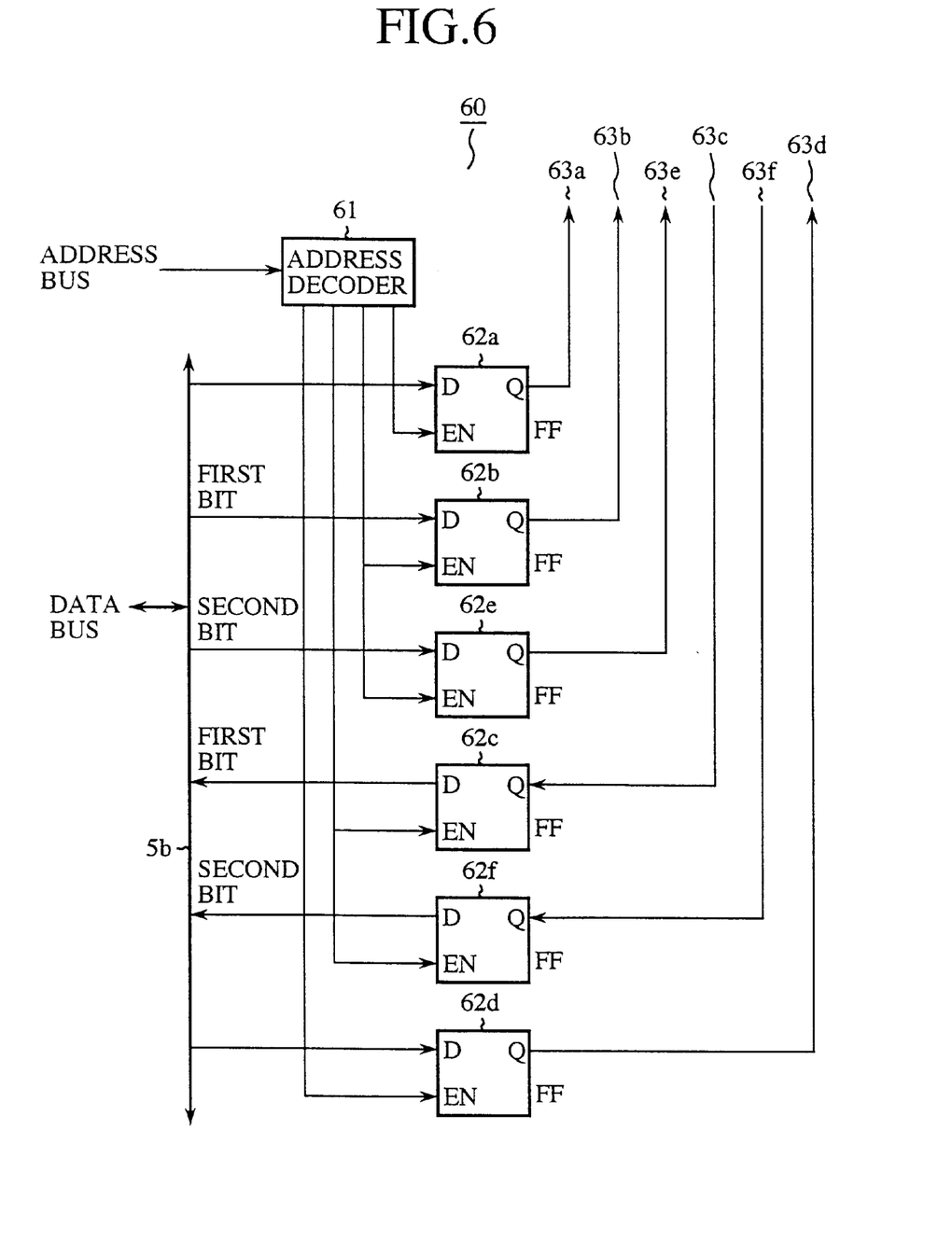
FIG. 6 is a diagram showing a configuration of a test circuit (or a test device) for a scan test in the semiconductor integrated circuit as the fourth and fifth embodiments according to the present invention.

FIG. 6 is a diagram showing a configuration of a test circuit for the scan test in the semiconductor integrated circuit as the fourth embodiment according to the present invention. In the test circuit shown in FIG. 6, flip flops FF 62e and 62f, each having the data enable terminal EN, are added in addition to the configuration of the scan test circuit 6 shown in FIG. 4 in the first embodiment. This causes to form more two shift registers in the user logic section 4. Other components in the semiconductor integrated circuit having the test circuit 60 and the input signal generation and output signal detection circuit 12 as the fourth embodiment are the same of the components and the circuit 12 in the second embodiment shown in FIG. 5, therefore the explanation of them is omitted here for brevity.

Next, a description will be given of the operation of the semiconductor integrated circuit having the test circuit 60 as the fourth embodiment.

When the scan test circuit 60 is incorporated in the semiconductor integrated circuit, the scan test circuit 60 may be connected to two shift registers in the user logic section 4, for example. Accordingly, it is possible to operate the two shift registers in the user logic section 4 simultaneously by using the scan test circuit 60 that is applicable to a plurality of scan paths.

As described above, according to the semiconductor integrated circuit having the scan test circuit 60 as the fourth embodiment, it is possible to perform setting two values for the scan-in operation and to perform reading out of two values for the scan-out operation simultaneously during one read/write operation, so that it is also possible to reduce the time of the scan test approximately one-half time when comparing with the test time required to the user logic section in the semiconductor integrated circuit of the third embodiment.

Fifth Embodiment

The configuration of the semiconductor integrated circuit having the test device of the fifth embodiment is the same as that of the semiconductor integrated circuit of the second embodiment shown in FIG. 5, the same reference numbers are used for the components, therefore the explanation of the same components in the semiconductor integrated circuit of the fifth embodiment is omitted here for brevity.

In the semiconductor integrated circuit as the fifth embodiment, the test data items to be stored in the ROM 11 and the expected data items are compressed in advance and the compressed data are stored in the ROM 11. Further, an decoding program for extracting the compressed data items is also stored in the ROM 11. Then, the CPU 2 performs the extraction program stored in the RAM 2 to extract the compressed data.

Next, a description will be given of the operation of the semiconductor integrated circuit as the fifth embodiment.

The compressed test data items, the test program including an extraction algorithm to extract the compressed test data items, and the compressed expected data items are transferred from the ROM 11 to the RAM 2 by using the same manner described in the explanation of the second embodiment, and then the CPU 3 performs the extraction algorithm that was added in the test program. The following test operation performed by using the extracted test data items.

As described above, according to the semiconductor integrated circuit as the fourth embodiment, because the compressed test data items are transferred from the ROM 11 to the RAM 2, it is therefore possible to reduce the size of the ROM 11. In addition to this effect, it is also possible to reduce the data transfer time from the ROM 11 to the RAM 2 in the semiconductor integrated circuit. This causes to perform the test operation using a long test pattern in a short time.

Sixth Embodiment

Figure 7:
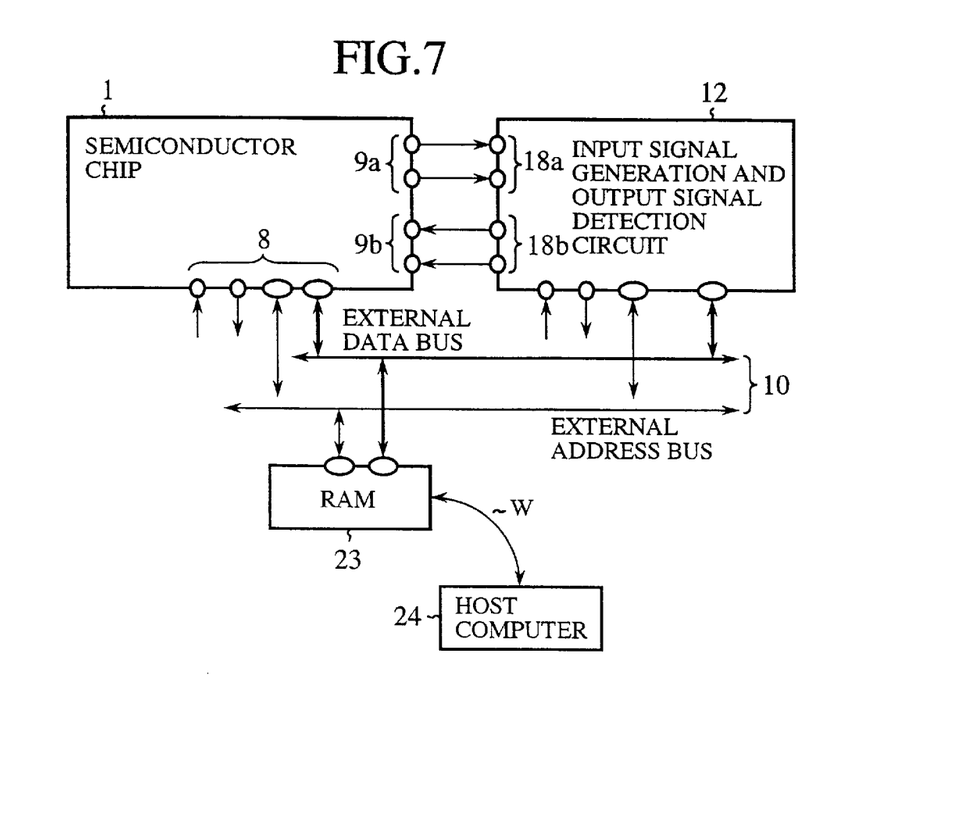
FIG. 7 is a diagram showing a configuration of a semiconductor integrated circuit with a test circuit (or a test device) as the sixth embodiment according to the present invention.

FIG. 7 is a diagram showing a configuration of the semiconductor integrated circuit with a test circuit as the sixth embodiment according to the present invention. In the sixth embodiment, a RAM 23 is used instead of the ROM 11 that is incorporated in the case of the second embodiment shown in FIG. 5, and this RAM 23 is connected to a host computer 24 through a cable W.

Next, a description will be given of the operation of the semiconductor integrated circuit as the sixth embodiment.

The host computer 24 may set and change the contents of data such as test data items, a test program, expected data items, and the like. Then, the test data items stored in the RAM 24 are supplied to the CPU 3 through the external buses 10, the external bus IF unit 7, and the internal bus 5. The following test processes are the same as the processes in the testing manner that has already been described in the explanation of the semiconductor integrated circuit as second embodiment.

Although another process to change the contents of the data items and the test program stored in the ROM 11 must be required in the semiconductor integrated circuits of the first to fifth embodiments, according to the semiconductor integrated circuit as the sixth embodiment as described above, it is possible to easily change the contents of the test data items, the test program, and the expected data items, and the like by the host computer 24.

As set forth above, according to the present invention, the scan test circuit (as the test device) is incorporated in the semiconductor integrated circuit and the scan test circuit is connected directly to the user logic section to be tested and connected to the CPU and the RAM through the internal bus. It is thereby possible to perform the scan test operation without any using external tester whose cost is expensive, and to reduce the testing time. In addition to the effect, because the test operation is performed in the semiconductor integrated circuit, it is not required to form test terminals to be connected to external test devices on the semiconductor chip on which the semiconductor integrated circuit having the scan test circuit is mounted, so that it is possible to reduce the configuration of the semiconductor integrated circuit.

Furthermore, according to the present invention, because the input signal generation and output signal detection circuit is connected to the target test circuit to be tested in the semiconductor integrated circuit, it is possible to apply the scan test method to the user logics in the target test circuit (as the user logic section) without any dedicated test pins on the semiconductor chip and without using any expensive logic tester.

Moreover, according to the present invention, because the test program in the RAM is executed after the test program stored in the external ROM is transferred to the RAM incorporated in the semiconductor integrated circuit, it is possible to reduce the testing time.

Furthermore, according to the present invention, because the scan test circuit is applicable to a plurality of scan paths in the target test circuit, it is possible to set a plurality of scan test paths in the target test circuit and it is also possible to reduce the testing time.

In addition, according to the present invention, because data such as the test program, the test data items, the expected data items and the like are compressed and stored in the ROM, and because an extraction program of an extraction logic is added into the compressed test program and the extraction program is performed during the test operation, it is possible to reduce the size of the ROM and RAM, and it is possible to reduce the testing time.

Furthermore, according to the present invention, the RAM is used instead of the external ROM, and the contents of data stored in the RAM are changed by using the host computer, it is possible to easily change the contents of the test data items and the test program without any dedicated device to change the contents of data stored in the ROM.

While the above provides a full and complete disclosure of the preferred embodiments of the present invention, various modifications, alternate constructions and equivalents may be employed without departing from the scope of the invention. Therefore the above description and illustration should not be construed as limiting the scope of the invention, which is defined by the appended claims.

What is claimed is:

1. A semiconductor integrated circuit having a test device comprising:

a central processing unit (CPU);

internal memory means;

a target test circuit comprising a plurality of flip flops that are connected one another in a line like a string of beads as a shift register; and a scan test circuit for providing test data to the target test circuit in order to operate the plurality of flip flops as the shift register, wherein the CPU, the internal memory means; the target test circuit, and the scan test circuit are connected through internal buses and are mounted on a same semiconductor chip.

2. A semiconductor integrated circuit having a test device as claimed in claim 1, wherein the scan test circuit comprises:

an address decoder connected to an address bus forming the internal buses;

a plurality of flip flops, each flip flop is addressed by an address decoded by the address decoder, connected to the plurality of flip flops in the target test circuit in order to perform as a shift register, and for inputting and outputting data items between the target test circuit, the CPU, and the internal memory means through a data bus forming the internal buses.

3. A semiconductor integrated circuit having a test device as claimed in claim 2, further comprising external memory means for storing the test data and for providing the test data to the internal memory means mounted on the semiconductor chip.

4. A semiconductor integrated circuit having a test device as claimed in claim 3, wherein the external memory means stores compressed test data and test program including an extraction process for extracting the compressed test data, wherein the CPU executes the test program stored in the internal memory means to extract the compressed test data and then executes the test program after the compressed test data and the test program have been transferred to the internal memory means.

5. A semiconductor integrated circuit having a test device as claimed in claim 1, further comprising external memory means for storing data relating the test data and for providing the test data to the internal memory means mounted on the semiconductor chip.

6. A semiconductor integrated circuit having a test device as claimed in claim 5, wherein the external memory means stores compressed test data and test program including an extraction process for extracting the compressed test data, wherein the CPU executes the test program stored in the internal memory means to extract the compressed test data and then executes the test program after the compressed test data and the test program have been transferred to the internal memory means.

7. A semiconductor integrated circuit having a test device as claimed in claim 5, wherein the external memory means comprises a read only memory.

8. A semiconductor integrated circuit having a test device as claimed in claim 1, wherein the scan test circuit comprising a plurality of flip flops that are connected to the plurality of flip flops in the target test circuit in order to form the shift register.

9. A semiconductor integrated circuit having a test device as claimed in claim 1, wherein the internal memory means comprises a random access memory.

10. A semiconductor integrated circuit having a test device comprising:

a central processing unit (CPU);

internal memory means;

a target test circuit comprising a plurality of flip flops that are connected one another in a line like a string of beads as a shift register;

a scan test circuit for operating the plurality of flip flops in the target test circuit as the shift register, wherein the CPU, the internal memory means, the target test circuit, and the scan test circuit are connected through internal buses and are mounted on a same semiconductor chip, an input signal generation and output signal detection circuit, connected to the target circuit through external buses, for generating and providing test data to the target test circuit, and for detecting output signals transferred from the target test circuit; and an external memory means, connected to the input signal generation and output signal detection circuit through the external buses and the internal buses, for storing the test data.

11. A semiconductor integrated circuit having a test device as claimed in claim 10, wherein the input signal generation and output signal detection circuit comprises:

a plurality of flip flops for storing the output signals from the target test circuit to detect the output signals;

a plurality of flip flops for setting the input signals to be transferred to the target test circuit;

an address decoder for decoding an address transferred from the CPU and for accessing the plurality of flip flops for the input signals and the output signals based on the decoded result; and control means for controlling to input the test data from the external memory means.

12. A semiconductor integrated circuit having a test device as claimed in claim 10, wherein the external memory means stores the test data and provides the test data to the internal memory means mounted on the semiconductor chip.

13. A semiconductor integrated circuit having a test device as claimed in claim 12, wherein the external memory means stores compressed test data and test program including an extraction process for extracting the compressed test data, wherein the CPU executes the test program stored in the internal memory means to extract the compressed test data and then executes the test program after the compressed test data and the test program have been transferred to the internal memory means.

14. A semiconductor integrated circuit having a test device as claimed in claim 10, wherein the scan test circuit comprising a plurality of flip flops that are connected to the plurality of flip flops in the target test circuit in order to form the shift register.

15. A semiconductor integrated circuit having a test device as claimed in claim 10, wherein the external memory means comprises a read only memory and the internal memory means comprises a random access memory.

16. A system of a semiconductor integrated circuit having a test device, the system comprising:

a central processing unit (CPU);

internal memory means;

a target test circuit comprising a plurality of flip flops that are connected one another in a line like a string of beads as a shift register;

a scan test circuit for operating the plurality of flip flops in the target test circuit as the shift register, wherein the CPU, the internal memory means, the target test circuit, and the scan test circuit are connected through internal buses and are mounted on a same semiconductor chip, an input signal generation and output signal detection circuit, connected to the target circuit through external buses, for generating and providing test data to the target test circuit, and for detecting output signals transferred from the target test circuit;

an external memory means, connected to the input signal generation and output signal detection circuit through the external buses and the internal buses, for storing the test data; and a host computer, connected to the external memory means, for providing data including the test data and a test program to be stored in the external memory means, and for changing contents of the data stored in the external memory means.

17. A system of a semiconductor integrated circuit having a test device as claimed in claim 16, wherein the internal memory means comprises a random access memory.

* * * * *